United States Patent
Ukraintsev

(10) Patent No.: US 8,305,097 B2
(45) Date of Patent: Nov. 6, 2012

(54) METHOD FOR CALIBRATING AN INSPECTION TOOL

(75) Inventor: Vladimir A. Ukraintsev, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1437 days.

(21) Appl. No.: 11/849,660

(22) Filed: Sep. 4, 2007

(65) Prior Publication Data

US 2009/0061543 A1    Mar. 5, 2009

(51) Int. Cl.
*G01R 31/00* (2006.01)
(52) U.S. Cl. .......... 324/750.02; 438/14; 73/105; 257/48
(58) Field of Classification Search ............. 324/750.02; 438/14; 257/48; 73/105
See application file for complete search history.

(56) References Cited

U.S. PATENT DOCUMENTS 7,626,406 B2 * 12/2009 Ishii ................. 324/754.03

* cited by examiner

*Primary Examiner* — David Vu
*Assistant Examiner* — Brandon Fox
(74) *Attorney, Agent, or Firm* — Alan A. R. Cooper; Wade James Brady, III; Frederick J. Telecky, Jr.

(57) ABSTRACT

Provided is a method for manufacturing a semiconductor device. The method, in one embodiment, includes calibrating an inspection tool configured to obtain a measurement of a semiconductor feature, including: 1) providing a test structure comprising a substrate having a trench therein, and a post feature located over the substrate adjacent the trench. The post feature, in this embodiment, includes a second layer positioned over a first layer, wherein the first layer has a notch or bulge in a sidewall thereof; 2) finding a location of the notch or bulge relative to a different known point of the test structure using a probe of the inspection tool; and 3) calculating a dimension of the probe using the relative locations of the notch or bulge and the different known point.

20 Claims, 4 Drawing Sheets

METHOD FOR CALIBRATING AN INSPECTION TOOL

TECHNICAL FIELD

The disclosure is directed, in general, to a method for manufacturing a semiconductor device and, more specifically, to a method for manufacturing a semiconductor device using a calibrated inspection tool.

BACKGROUND

Current demands for high density and performance associated with ultra large scale integration require submicron features, increased transistor and circuit speeds, and improved reliability. Such demands require formation of device features with high precision and uniformity, which in turn necessitates careful process monitoring. Careful process monitoring typically includes frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (e.g., a photoresist layer), which has been previously coated on a layer, such as a polysilicon or metal layer formed on the silicon wafer. The transfer of the mask pattern onto the photoresist layer is performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. Design rules set limits on critical dimension ("CD"), which may be defined as any linewidth of interest in a device containing a number of different linewidths. The CD for most features in ultra large scale integration applications is on the order of a fraction of a micron, however, it generally depends on the specific feature.

As design rules shrink and process windows (e.g., the margins for error in processing) become smaller, inspection and measurement of surface feature CD's, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate processing problems, such as stepper defocusing or photoresist loss due to over-exposure.

Current CD inspection and measurement techniques, however, have various different drawbacks. Accordingly, what is needed in the art is a CD inspection and measurement technique that does not experience the drawbacks of those that currently exist.

SUMMARY

To address the above-discussed deficiencies of the prior art, provided is a method for manufacturing a semiconductor device. The method, in one embodiment, includes calibrating an inspection tool configured to obtain a measurement of a semiconductor feature, including: 1) providing a test structure comprising a substrate having a trench therein, and a post feature located over the substrate adjacent the trench. The post feature, in this embodiment, includes a second layer positioned over a first layer, wherein the first layer has a notch or bulge in a sidewall thereof; 2) finding a location of the notch or bulge relative to a different known point of the test structure using a probe of the inspection tool; and 3) calculating a dimension of the probe using the relative locations of the notch or bulge and the different known point. This method may further include forming one or more semiconductor features over a semiconductor wafer, and obtaining a measurement of the one or more semiconductor features using the calibrated inspection tool.

BRIEF DESCRIPTION OF THE DRAWINGS

For a more complete understanding of the disclosure, reference is now made to the following descriptions taken in conjunction with the accompanying drawings, in which.

DETAILED DESCRIPTION

Figure 1:
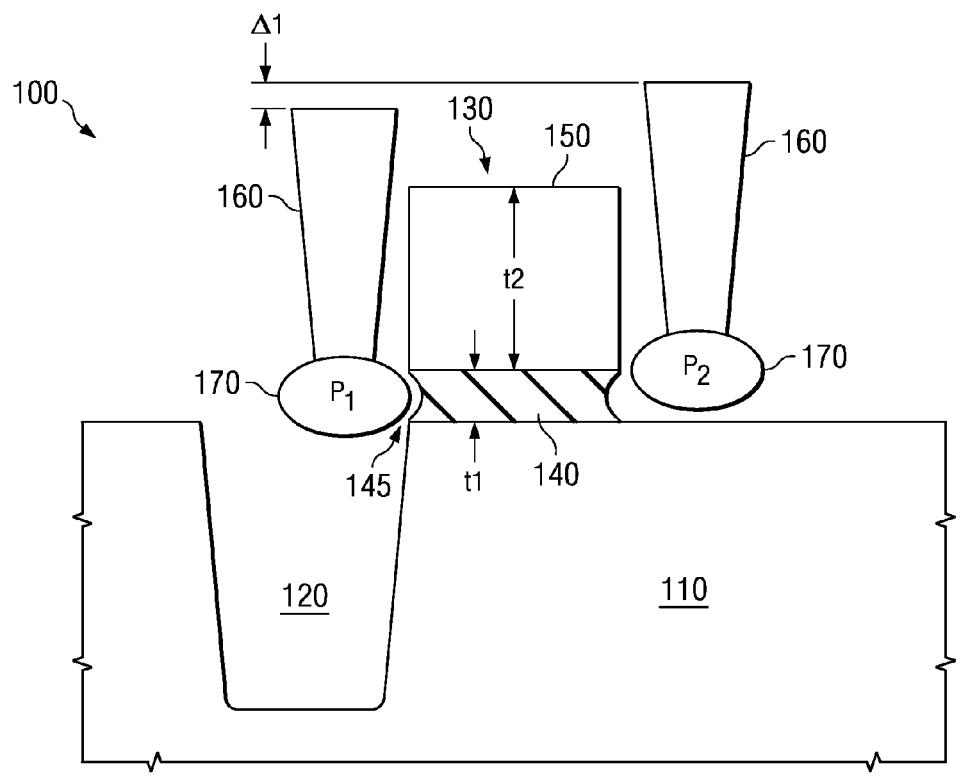
FIG. 1 illustrates a test structure manufactured in accordance with the disclosure.

The instant disclosure is based, at least on part, on the acknowledgement that present calibration techniques for inspection tools (e.g., an atomic force microscope (AFM) in one embodiment) are lacking. More specifically, the instant disclosure acknowledges that present calibration techniques are generally unable to quickly and accurately ascertain the ever changing physical dimensions (e.g., edge height) of the probe (e.g., probe tip or flare tip) used by the inspection tools. For instance, the physical dimensions of many probe tips tend to change as they are repeatedly used. Additionally, particulate matter often appends to the probe tips, ultimately changing the physical dimension thereof. As the current calibration techniques are unable to quickly and accurately ascertain the ever changing physical dimensions of the probe tip, an accurate calibration is often unattainable. Accordingly, the measurements (e.g., critical dimension (CD) measurements in one embodiment) of the semiconductor features taken using the improperly calibrated inspection tool are also often inaccurate.

Based at least partially upon the aforementioned acknowledgement, the instant disclosure recognizes a test structure that can be used to quickly and accurately ascertain the physical dimension (e.g., the radius of curvature in an embodiment) of the probe of the inspection tool. The test structure, in one embodiment, includes a substrate having a trench therein. The test structure, in this embodiment, further includes a post feature located over the substrate adjacent the trench, the post feature including a second layer positioned over a first layer. The first layer, in this embodiment, includes a notch or bulge in a sidewall thereof.

Using the test structure discussed directly above, or another test structure manufactured according to the disclosure, an inspection tool may be properly calibrated. For example, the inspection tool can be calibrated by scanning the probe of the inspection tool over the test structure, thereby finding a location of the notch or bulge of the test structure relative to a different known point of the test structure. Thereafter, the relative locations of the notch or bulge and the different known point are used to calculate a dimension of the probe, thereby assisting in the calibration of the inspection tool. It should be noted that the process for calibrating the inspection tool in accordance with this disclosure provides an absolute calibration (e.g., measurement) of the dimension (e.g., edge height, radius of curvature, etc.), as opposed to previous processes that provide only relative calibrations.

Unique to the present disclosure, the materials used for the first layer and second layer, as well as the process used to form the notch or bulge, allow the location (e.g., vertical location) of the notch or bulge to be identified based upon the thickness of the first layer. For example, if a wet etch that is selective to the first layer is used to form a notch, the notch would generally be positioned at a midpoint of the first layer. Accordingly, using this process the center point of the notch would be located at a location equal to one half the thickness of the first layer. This recognition limits the number of unknown variables used in the calibration of the inspection tool, thus making the calibration much easier. Additionally, if a wet etch that is selective to the second layer is used to form a bulge, the bulge would generally be positioned at a midpoint of the first layer.

FIG. 1 illustrates a test structure 100 manufactured in accordance with the disclosure. Positioned over, and in this embodiment substantially in contact with the test structure 100, is a probe 160 (e.g., including a probe tip 170) of an inspection tool. The probe 160 of FIG. 1 is illustrated as being located at two different positions (a first position ($P_1$) as well as at a second position ($P_2$)).

The test structure 100 illustrated in FIG. 1 initially includes a substrate 110. The substrate 110 may, in one embodiment, be any layer located in the structure 100, including a wafer itself or a layer located above the wafer (e.g., epitaxial, grown or deposited layer). The substrate 110 may additionally include many different materials, and may in certain embodiments include one or more dopants. In the given embodiment of FIG. 1, the substrate 110 comprises silicon.

Located within the substrate 110 is a trench 120. The trench 120, in the embodiment shown, is located adjacent a post feature 130 located over the substrate. The term "adjacent", as used in this context, means that the opening of the trench 120 is located within a short distance of a base of the post feature 130. In one embodiment, the opening of the trench 120 is located at a point where an edge of the post feature 130 meets the substrate 110. While not shown, a second trench could be located in the substrate 110, including on an opposing side of the post feature 130.

The trench 120 may have many different dimensions, shapes, etc. and remain within the scope of the disclosure. For instance, the trench 120 may have many different widths and depths. Nevertheless, in one embodiment it is helpful that the width of the trench 120 is greater than a width of the tip 170 of the probe 160, as well as a depth of the trench 120 is greater than a height of the tip 170. Additionally, the shape of the trench 120, including the slope of the sidewalls thereof, may vary.

Located over the substrate 110 and adjacent the trench 120 is the post feature 130. The post feature 130 includes a first layer 140. The first layer 140 has a thickness ($t_1$), as well as a notch 145 (or a number of notches in certain embodiments) in a sidewall thereof. While the notch 145 is illustrated in FIG. 1, in an alternative embodiment the surface feature in the sidewall of the first layer 140 might be a bulge. Accordingly, the present disclosure should not be limited to either a notch or a bulge, as either would generally work. The first layer 140 may comprise many different materials, but generally should comprise a material different from the substrate 110 and the second layer 150. In one example embodiment, however, the first layer 140 comprises silicon dioxide. For example, the first layer 140 could be a silicon dioxide layer having a thickness of about 10 nm or less. In one example embodiment, the first layer 140 comprises silicon dioxide and has a thickness of about 5 nm or less. In yet another example embodiment the first layer 140 has a thickness of about 1 nm or less. The lesser thicknesses of the first layer 140 limit any uncertainty associated with the calibration.

The notch 145 in the sidewall of the first layer 140 may vary in size, as well as depth into the first layer 140. Nevertheless, in one example embodiment the notch 145 extends from the bottom of the first layer 140 to the top of the first layer 140, is centered at a midpoint thereof, and extends into the first layer from about 1 nm to about 10 nm. As those skilled in the art appreciate, the size, location and depth of the notch 145 will generally be controlled by the specific etch chemistry used, as well as the amount of time the first layer 140 is subjected to the etch. More details regarding the etch used to form the notch 145 will be discussed below.

Positioned over the first layer 140 is a second layer 150. The second layer 150 has a thickness ($t_2$). The second layer 150 may also comprise many materials; however, as indicated above the second layer 150 should comprise a different material than the first layer 140. Accordingly, in one example embodiment the second layer 150 comprises silicon nitride. Silicon nitride, among others, is a good choice as it tends to resist many of the etches that might be used to form the notch in the first layer 140.

A test structure, such as the test structure 100 illustrated in FIG. 1, may be manufactured using different processes. In one example embodiment the test structure 100 is manufactured by growing a first material layer comprising silicon dioxide over the substrate 110 to a desired thickness. The growth of the first material layer allows its thickness to be known with great accuracy. Thereafter, a second material layer, in this instance comprising silicon nitride, may then be formed over the first material layer. For example, a physical vapor deposition (PVD) process could be used to deposit the second material layer. The first and second material layers, in this example embodiment, would then be subjected to a patterning process, thereby resulting in the post feature 130. Thereafter, the trench 120 (or trenches if used) could be formed within the substrate 110 adjacent the post feature 130.

Additionally, either before or after forming the trench 120, the notch 145 in the sidewall of the first layer 140 is formed. In the embodiment wherein the first layer 140 comprises silicon dioxide, a silicon dioxide wet etch could be used to form the notch 145. Such a wet etch would be selective to the silicon dioxide, and thus would have little to no effect on the substrate 110 or the second layer 150. Additionally, the silicon dioxide wet etch would form a notch, such as the notch 145 of FIG. 1. Were a bulge to be used, as opposed to the notch of FIG. 1, an etch selective to the second layer 150 might be used for its creation. Those skilled in the art of etch chemistries, particularly after being advised of the need and intended use for the notch 145, or bulge for that matter, would be able to choose the particular etch needed for a given first layer 140 or second layer 150.

An inspection tool, for instance an inspection tool having the probe 160 and probe tip 170, can be calibrated using a test structure, such as the test structure 100. In the embodiment of FIG. 1, the inspection tool may be calibrated by scanning the probe tip 170 over the test structure 100. In doing so, the probe tip is (at one instance or another) positioned at the first known position ($P_1$) and the second known position ($P_2$). In the embodiment of FIG. 1, the first known position ($P_1$) is the notch 145 and the second known position ($P_2$) is a top surface of the substrate 110. In this embodiment, the trench 120 allows the probe tip 170 to extend below the top surface of the substrate 110, and thus properly observe the location of the notch 145 at the first known position ($P_1$).

Knowing a location of the notch 145 relative to a different known point (e.g., the top surface of the substrate in the embodiment of FIG. 1), a dimension of the probe tip 170 may be calculated. In one embodiment, this dimension is a radius of curvature of the leading edge of the probe tip, and more specifically a radius of curvature of a lower quadrant of the leading edge of the probe tip. Other dimensions may additionally be calculated using aspects of this disclosure.

In one embodiment, the calculating of this dimension is accomplished using the equation $R_1=\Delta_1+\frac{1}{2}t_1$, wherein $R_1$ is a radius of curvature of the leading edge of the probe tip, $\Delta_1$ is a difference in relative location of the notch 145 and the top surface of the substrate 110, and $t_1$ is a thickness of the first layer 140. Using this equation, the radius of curvature $R_1$ may be calculated, thus ultimately leading to the calibration of the inspection tool. For example, assuming that the first layer 140 has a thickness ($t_1$) of about 5 nm, and that the difference in relative location of the notch and the top surface of the substrate 110 is about 2 nm, the radius of curvature ($R_1$) for the leading edge of the probe tip 170 would be about 4.5 nm. As opposed to traditional calibration techniques, this value is an absolute value and not a relative value.

Figure 2:
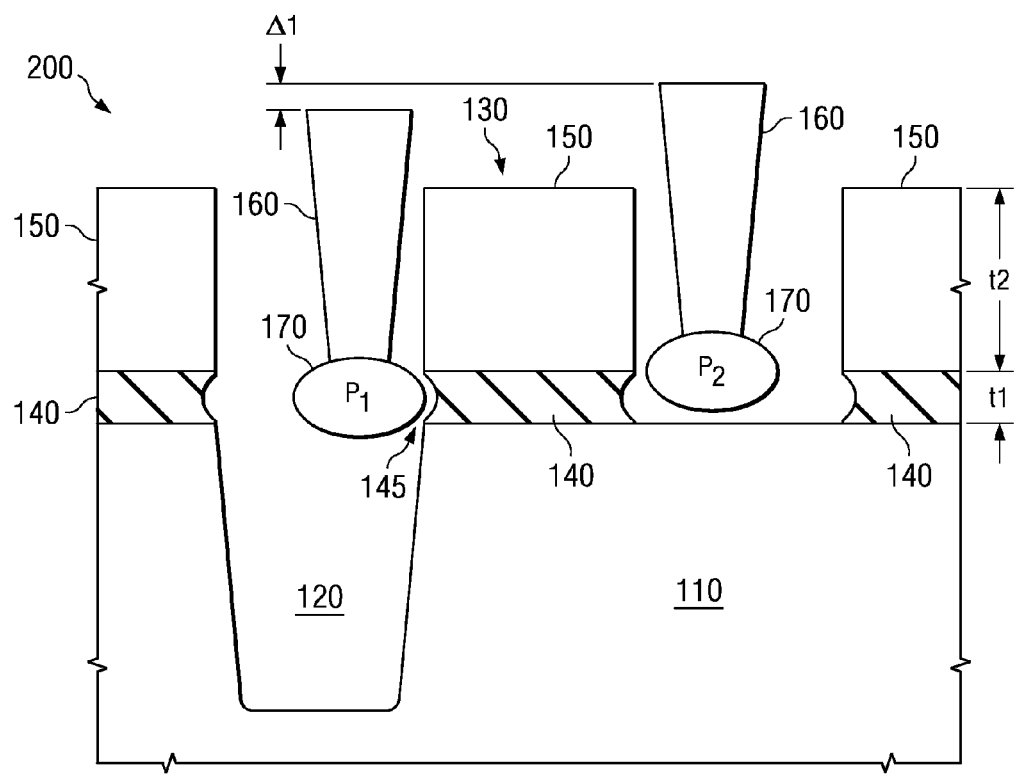
FIG. 2 illustrates an alternative embodiment of the test structure of FIG. 1.

FIG. 2 illustrates an alternative embodiment of the test structure 100 of FIG. 1. The only significant difference between the test structure 200 of FIG. 2 and the test structure 100 of FIG. 1 is the patterning of the post feature 130. For example, in FIG. 1 the post feature 130 is the only remaining portion of the first and second material layers, whereas in FIG. 2 other portions remain from the first and second material layers.

Figure 3:
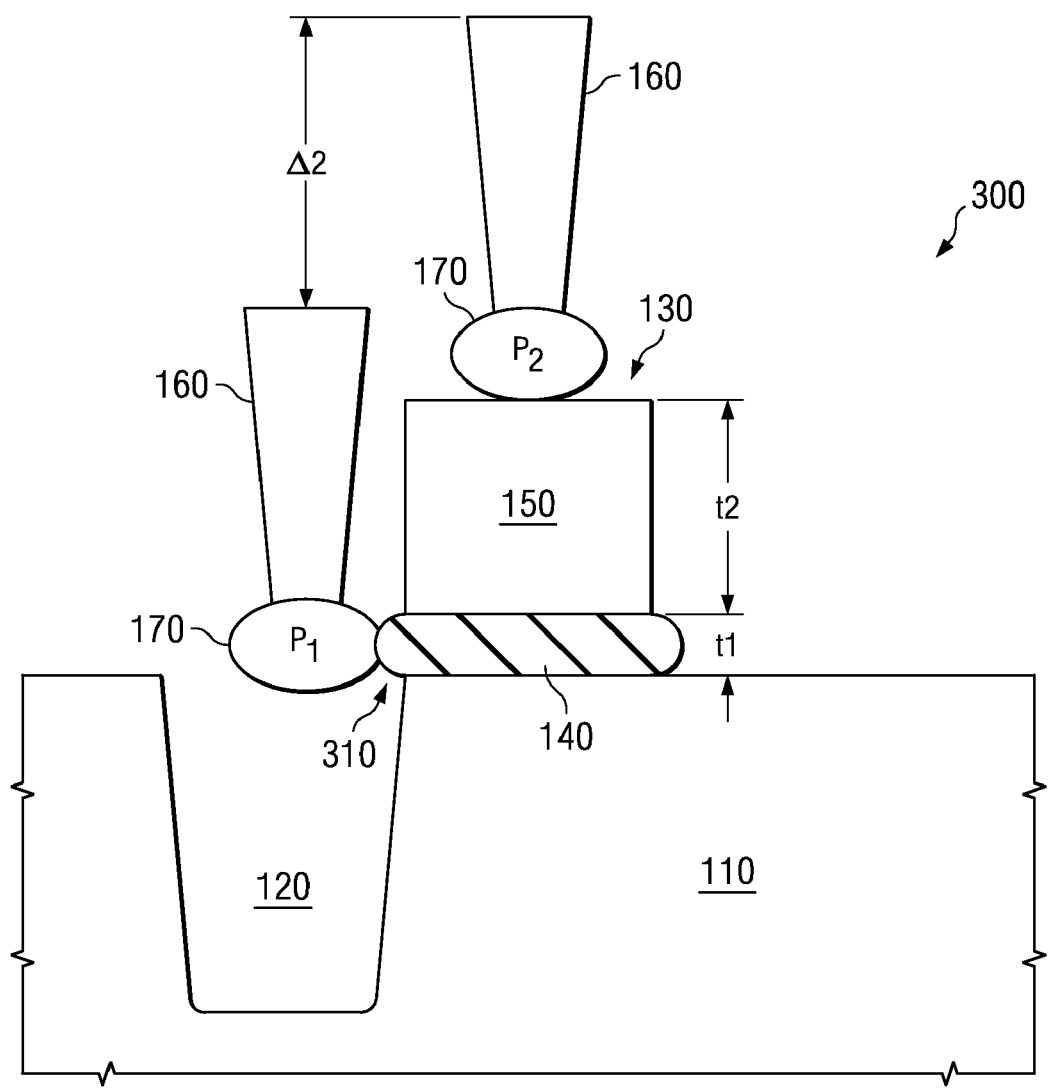
FIG. 3 illustrates an alternative embodiment of a test structure manufactured in accordance with the disclosure.

FIG. 3 illustrates an alternative embodiment of the disclosure. More specifically, the embodiment of FIG. 3 illustrates an alternative embodiment for using a test structure 300 to calibrate an inspection tool. The test structure 300 of FIG. 3 is substantially similar to the test structure 100 of FIG. 1 with the exception that the test structure 300 includes one or more bulges 310 and the test structure 100 includes the one or more notches 145. In the embodiment of FIG. 3, the inspection tool may be calibrated by scanning the probe tip 170 over the test structure 300. In doing so, the probe tip 170 is (at one instance or another) positioned at a first known position ($P_1$) and a second known position ($P_2$). In the embodiment of FIG. 3, however, the first known position ($P_1$) is the bulge 310 and the second known position ($P_2$) is a top surface of the second layer 150.

Knowing a location of the bulge 310 relative to a different known point (e.g., the top surface of the second layer 150 in the embodiment of FIG. 3), a dimension of the probe tip 170 may be calculated using these known relative locations. In the embodiment of FIG. 3, the calculating of this dimension is accomplished using the equation $R_2=\Delta_2-t_2-\frac{1}{2}t_1$, wherein $R_2$ is a radius of curvature of the probe, $\Delta_2$ is a difference in relative location of the bulge 310 and the top surface of the second layer 150, $t_2$ is a thickness of the second layer 150 and $t_1$ is a thickness of the first layer 140. Using this equation, the radius of curvature $R_2$ may be calculated, thus ultimately leading to the calibration of the inspection tool. For example, assuming that the first layer 140 has a thickness ($t_1$) of about 5 nm, the second layer has a thickness ($t_2$) of about 50 nm, and that the difference ($t_2$) in relative location of the bulge 310 and the top surface of the substrate 110 is about 60 nm, the radius of curvature ($R_2$) for the leading edge of the probe tip is about 7.5 nm.

Figure 4:
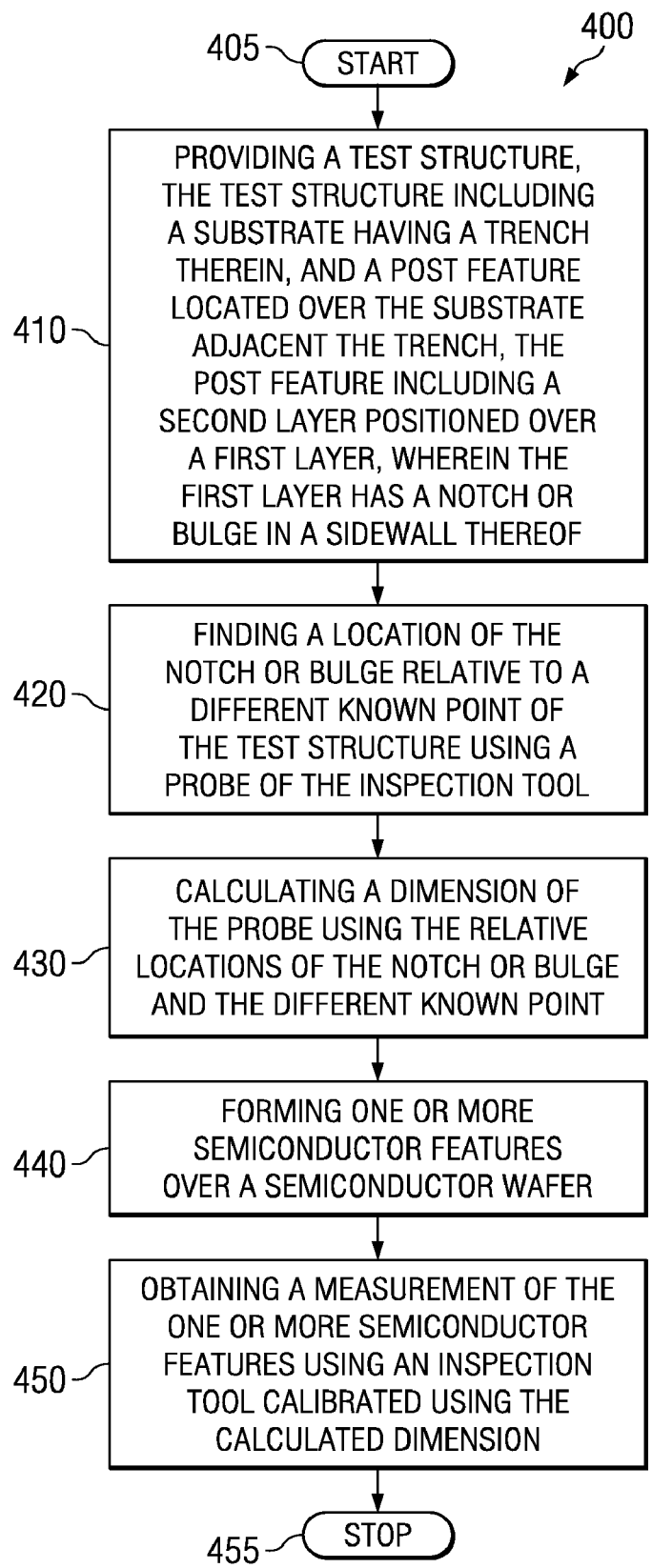
FIG. 4 illustrates a flow diagram indicating how one might manufacture a semiconductor device in accordance with the disclosure.

FIG. 4 illustrates a flow diagram 400 depicting a process for manufacturing a semiconductor device. The flow diagram begins in a start step 405. Thereafter, in a step 410, a test structure is provided. The test structure provided in this step could be similar to the test structure described above with respect to FIGS. 1 and 2. In this instance, the test structure would include a substrate having a trench therein. The test structure would additionally include a post feature located over the substrate adjacent the trench, the post feature including a second layer positioned over a first layer. Additionally, the first layer would include a notch or bulge in a sidewall thereof. It should be noted that the term "provided", as used in this context, means that the test structure may be obtained from a party having already manufactured it, or alternatively may mean manufacturing the test structure themselves and providing it for its intended purpose.

After providing the test structure in the step 410, a probe tip of the inspection tool may be used to find a location of the notch or bulge of the test structure relative to another known point of the test structure, in a step 420. As discussed above, this may be accomplished by scanning the probe tip of the inspection tool over the two locations, if not over many locations of the test structure. In the embodiment wherein the inspection tool is an AFM, the probe tip generally glides just slightly above (e.g., a few nanometers above) all of the relative surfaces of the test structure. Accordingly, the AFM probe tip generally does not contact the test structure.

Thereafter, in a step 430, a dimension of the probe tip is calculated using the relative locations of the notch or bulge and the different known point. The dimension, in one embodiment, is a radius of curvature of the leading edge of the probe tip. As indicated above, a number of different equations may be used to calculate the dimension. Each of the different equations will typically require knowing different values of the test structure. After knowing the dimension of the probe tip, however, the inspection tool may be calibrated.

The process for forming the semiconductor device described in the flow diagram 400 of FIG. 4 additionally includes forming one or more semiconductor features over a semiconductor wafer, for example in a step 440. Such semiconductor features may, in one embodiment, be conventional features that might be found in a semiconductor device. For instance, the step 440 might include patterning one or more gate structures, each including a gate dielectric and gate electrode, over the semiconductor wafer. While the flow diagram of FIG. 4 depicts that the semiconductor features are formed after steps 410, 420 and 430, those skilled in the art understand that no order is implied by this. Accordingly, the semiconductor features may just as well be formed before or concurrently with steps 410, 420 and 430.

Having made the semiconductor features in step 440, in a step 450 the calibrated inspection tool may be used to obtain a measurement (e.g., CD measurement in one embodiment) of the one or more semiconductor features. Again, as the inspection tool is properly calibrated, the measurement obtained therefrom tends to be extremely accurate. Additionally, as the calibration of the inspection tool takes so little time, and moreover can be conducted within a chamber of the inspection tool, it can be calibrated and recalibrated as often as desired. After performing step 450, the process could return to any of the previous steps or alternatively conclude in a stop step 455.

Figure 5:
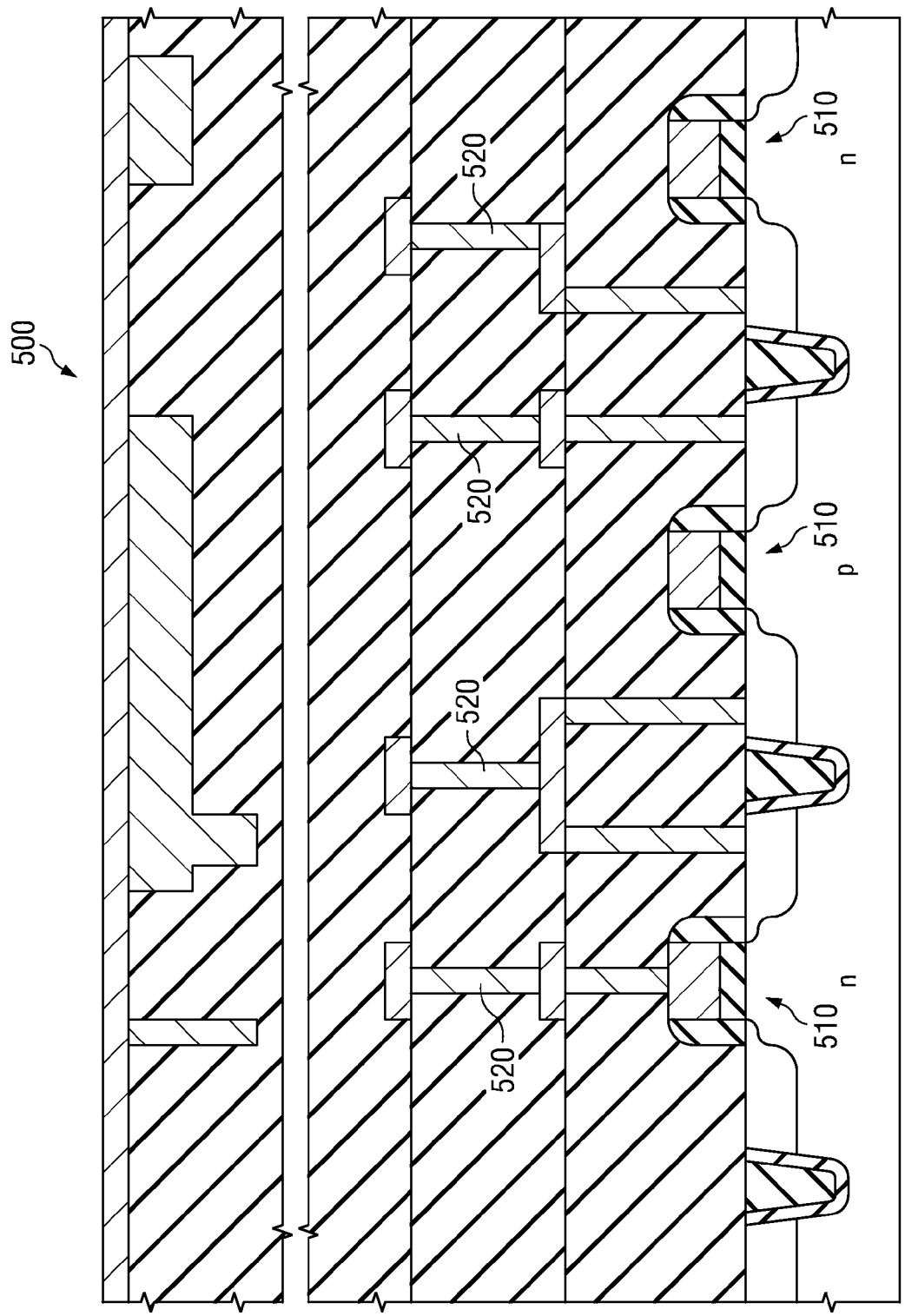
FIG. 5 illustrates an integrated circuit (IC) incorporating semiconductor devices constructed according to the disclosure.

FIG. 5 illustrates an integrated circuit (IC) 500 incorporating semiconductor devices constructed according to this disclosure. The IC 500 may include devices, such as transistors used to form CMOS devices, BiCMOS devices, Bipolar devices, as well as capacitors or other types of devices. The IC 500 may further include passive devices, such as inductors or resistors, or it may also include optical devices or optoelectronic devices. Those skilled in the art are familiar with these various types of devices and their manufacture. In the particular embodiment illustrated in FIG. 5, the IC 500 includes gate structures 510, interconnect structures 520 and other features that may benefit from an inspection tool calibrated in accordance with this disclosure.

Those skilled in the art to which the disclosure relates will appreciate that other and further additions, deletions, substitutions and modifications may be made to the described embodiments without departing from the scope of the disclosure.

What is claimed is:

1. A method for manufacturing a semiconductor device, comprising:
    calibrating an inspection tool configured to obtain a measurement of a semiconductor feature, including:
        providing a test structure, the test structure comprising;
            a substrate having a trench therein; and
            a post feature located over the substrate adjacent the trench, the post feature including a second layer positioned over a first layer, wherein the first layer has a notch or bulge in a sidewall thereof;
        finding a location of the notch or bulge relative to a different known point of the test structure using a probe of the inspection tool; and
        calculating a dimension of the probe using the relative locations of the notch or bulge and the different known point;
    forming one or more semiconductor features over a semiconductor wafer; and
    obtaining a measurement of the one or more semiconductor features using the calibrated inspection tool.

2. The method of claim 1 wherein the dimension of the probe is a radius of curvature of a leading edge of the probe.

3. The method of claim 1 wherein the different known point of the test structure is a top surface of the substrate having the trench therein.

4. The method of claim 3 wherein calculating includes calculating using the equation $R_1=\Delta_1+\frac{1}{2}t_1$, wherein $R_1$ is a radius of curvature of the probe, $\Delta_1$ is a difference in relative location of the notch or bulge and the top surface of the substrate, and $t_1$ is a thickness of the first layer.

5. The method of claim 1 wherein the different known point of the test structure is a top surface of the second layer.

6. The method of claim 5 wherein calculating includes calculating using the equation $R_2=\Delta_2-t_2-\frac{1}{2}t_1$, wherein $R_2$ is a radius of curvature of the probe, $\Delta_2$ is a difference in relative location of the notch or bulge and the top surface of the second layer, $t_2$ is a thickness of the second layer and $t_1$ is a thickness of the first layer.

7. The method of claim 1 wherein providing a test structure includes forming a first material layer over the substrate, forming a second material layer over the first material layer, patterning the first and second material layers into the post feature including the first and second layers, subjecting the first layer or second layer to a selective etch to form the notch or bulge, and forming the trench in the substrate proximate the post feature.

8. The method of claim 1 wherein the trench is a first trench located proximate a first side of the post feature, and further including a second trench located in the substrate and proximate an opposing side of the post feature.

9. The method of claim 1 wherein the first layer has a thickness of about 5 nm or less.

10. The method of claim 1 wherein the first layer has the notch.

11. A method for calibrating an inspection tool, comprising:
    providing a test structure, the test structure including:
        a substrate having a trench therein; and
        a post feature located over the substrate adjacent the trench, the post feature including a second layer positioned over a first layer, wherein the first layer has a notch or bulge in a sidewall thereof;
    finding a location of the notch or bulge relative to a different known point of the test structure using a probe of an inspection tool; and
    calculating a dimension of the probe using the relative locations of the notch or bulge and the different known point.

12. The method of claim 11 wherein the dimension of the probe is a radius of curvature of a leading edge of the probe.

13. The method of claim 11 wherein the different known point of the test structure is a top surface of the substrate having the trench therein.

14. The method of claim 13 wherein calculating includes calculating using the equation $R_1=\Delta+\frac{1}{2}t_1$, wherein $R_1$ is a radius of curvature of the probe, $\Delta_1$ is a difference in relative location of the notch or bulge and the top surface of the substrate, and $t_1$ is a thickness of the first layer.

15. The method of claim 11 wherein the different known point of the test structure is a top surface of the second layer.

16. The method of claim 15 wherein calculating includes calculating using the equation $R_2=\Delta_2-t_2-\frac{1}{2}t_1$, wherein $R_2$ is a radius of curvature of the probe, $\Delta_2$ is a difference in relative location of the notch or bulge and the top surface of the second layer, $t_2$ is a thickness of the second layer and $t_1$ is a thickness of the first layer.

17. The method of claim 11 wherein providing a test structure includes forming a first material layer over the substrate, forming a second material layer over the first material layer, patterning the first and second material layers into the post feature including the first and second layers, subjecting the first layer or second layer to a selective etch to form the notch or bulge, and forming the trench in the substrate proximate the post feature.

18. The method of claim 11 wherein the trench is a first trench located proximate a first side of the post feature, and further including a second trench located in the substrate and proximate an opposing side of the post feature.

19. The method of claim 11 wherein the first layer has a thickness of about 5 nm or less.

20. The method of claim 11 wherein the first layer has the notch.

* * * * *